United States Patent [19]
Lee

[11] 4,037,115
[45] July 19, 1977

[54] BIPOLAR SWITCHING TRANSISTOR USING A SCHOTTKY DIODE CLAMP

[75] Inventor: Charles Meng-Yuan Lee, Berkeley Heights, N.J.

[73] Assignee: Bell Telephone Laboratories, Incorporated, Murray Hill, N.J.

[21] Appl. No.: 699,950

[22] Filed: June 25, 1976

[51] Int. Cl.² .................... H03K 19/40; H03K 5/08
[52] U.S. Cl. .................... 307/214; 307/237; 307/254; 307/317 A
[58] Field of Search .................... 307/213–215, 307/218, 254, 237, 317 A

[56] References Cited

U.S. PATENT DOCUMENTS

| | | |
|---|---|---|
| 3,515,899 | 6/1970 | May .................... 307/215 |
| 3,555,294 | 1/1971 | Treadway .................... 307/215 X |
| 3,766,406 | 10/1976 | Bryant et al. .................... 307/214 X |

*Primary Examiner*—John Zazworsky
*Attorney, Agent, or Firm*—Arthur J. Torsiglieri

[57] ABSTRACT

A transistor-transistor logic gate is described which uses a number of bipolar switching transistors clamped in several different ways. In particular to better adapt a bipolar switching transistor to high frequency, high temperature operation, the collectors of the various switching transistors are clamped in a variety of novel ways, each to achieve a collector voltage higher than that normally achieved by the conventional Schottky diode clamp connected between the base and collector.

2 Claims, 1 Drawing Figure

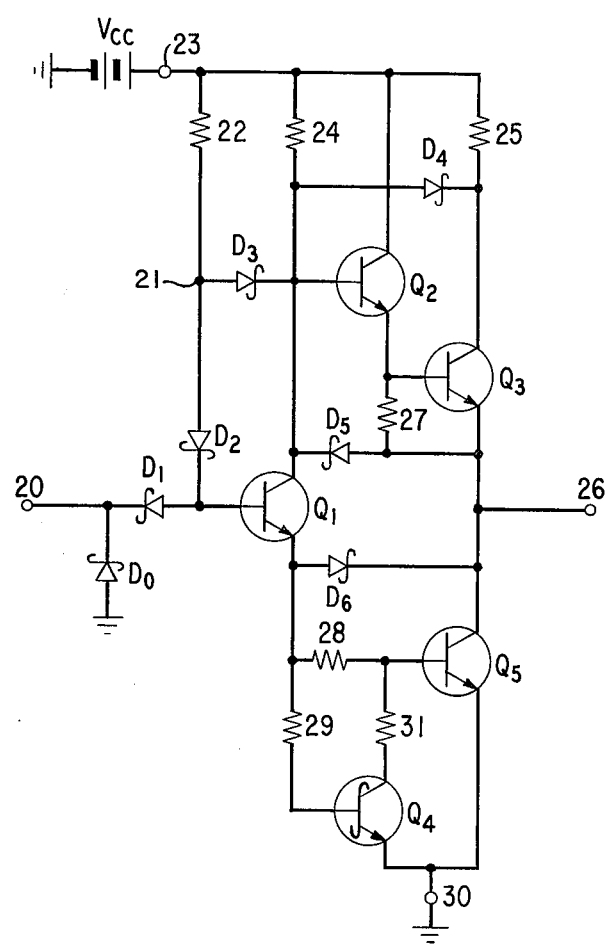

4,037,115

BIPOLAR SWITCHING TRANSISTOR USING A SCHOTTKY DIODE CLAMP

BACKGROUND OF THE INVENTION

This invention relates to a bipolar transistor switch which utilizes a Schottky barrier diode clamp to prevent saturation, and in a preferred embodiment relates to logic circuits using such transistor switches.

It is now well recognized that the speed of a bipolar switching transistor can be improved by preventing saturation, and a common technique for preventing such saturation involves including a Schottky barrier diode as a clamp between the base and collector of the transistor. A transistor so connected is now generally described as a Schottky transistor. See for example page 229 of *Integrated Electronics* by Millman and Halkias, published by McGraw-Hill (1972).

SUMMARY OF THE INVENTION

In such a transistor the extrinsic collector is clamped at a voltage given by $V_{be} - V_d$ where $V_{be}$ is the base-emitter forward voltage drop and $V_d$ is the forward voltage drop of the Schottky diode and the effective collector voltage is further reduced by the voltage drop associated with the collector series resistance. The forward voltage drop of the Schottky diode is a function of the height of the Schottky barrier, and for a platinum silicide contact to N-type silicon, a common form of Schottky diode, the voltage drop is approximately 0.65 volt at typical operating currents corresponding to a barrier height of approximately 0.85 volt. Moreover, since $V_{be}$ for a silicon Schottky transistor including a platinum silicide Schottky diode is about 0.85 volt, the intrinsic collector is clamped at about (0.85 volt − 0.65 volt − $I_c R_c$) where $I_c$ is the collector current and $R_c$ is the collector series resistance. This clamping technique is very effective so long as the $I_c R_c$ ohmic voltage drop remains small, but as this ohmic drop increases, the clamping becomes less effective. In particular, as the temperature of operation increases, as occurs as the power increases, $R_c$ also increases. Accordingly, in such instances with a platinum silicide Schottky diode, it is found difficult to keep the clamping effective at high temperatures for high speed switching without making the Schottky barrier connection of inordinately large area to reduce $R_c$ and commensurately increasing the area of the transistor, which is undesirable, particularly when the transistor is to be used in an integrated circuit such as a TTL gate.

One solution to this dilemma is to employ a Schottky diode which has a lower barrier height and so a lower forward voltage drop. A Schottky diode using aluminum or tungsten as the metal contact does have the required lower barrier height and forms a part of a solution widely practiced. However, such a diode offers other disadvantages. In particular, it is more difficult to make with reproducible characteristics.

It is in accordance with the present invention to solve the problem instead by utilizing a clamping arrangement which results in a voltage at the extrinsic collector higher than that given by $V_{be} - V_d$. This higher voltage may be achieved in several ways, each of which has its own advantage. In particular, in a preferred embodiment of the invention, a high speed TTL gate, three different novel arrangements of clamping are used, advantageously along with one standard arrangement, to provide a gate with improved speed and reduced dissipation, but otherwise compatible in operating parameters with lower speed versions of the same family of circuits. In particular, in an otherwise standard TTL gate, basically of the kind shown at page 187 of the aforementioned integrated circuits book, or in U.S. Pat. No. 3,555,294 which issued in Jan. 12, 1971, the phase splitting transistor, the pull-up Darlington-pair transistor, the pull-down transistor and the output transistor are each silicon switching transistors with different clamping but each involving a platinum silicide Schottky diode. In particular, the phase splitting transistor employs a pair of Schottky diodes in the base-collector circuit connected in a way to provide at the extrinsic collector a voltage simply of $V_{be}$. In the Darlington-pair transistor, a single Schottky diode is connected between the base of one transistor and the collector of the other transistor to provide an extrinsic collector voltage at 2 $V_{be} - V_d$. In the output transistor, a Schottky diode is combined with a resistor in the base-collector circuit to provide a voltage at the extrinsic collector of $V_{be} - V_d +$ the ohmic drop across the added resistor. Moreover, in the pull-down transistor, a Schottky diode is connected in the base-collector path in conventional fashion to provide a collector voltage of $V_{be} - V_d$.

BRIEF DESCRIPTION OF THE DRAWING

With reference now more particularly to the drawing, the FIGURE shows a circuit schematic of a high speed TTL circuit employing a number of switching transistors, three of which are clamped in accordance with the novel principles of the invention.

DETAILED DESCRIPTION

In the circuit depicted, the transistors are all silicon NPN transistors and the diodes are all N-type platinum silicide Schottky diodes.

With reference now to the circuit, back-to-back diodes $D_0$ and $D_1$ form one of the input stages of the gate (of which typically there would be several, for example, if the circuit was to serve as an "AND" gate) with the input terminal 20 being connected to the midpoint node of the pair, $D_1$ serving as the input diode and $D_0$ providing a clamp to ground. Alternatively, the input stage may comprise a multi-emitter transistor in the manner more characteristic of a TTL gate in which case the threshold voltage would tend to be increased. The anode of $D_1$ is connected to the phase splitting emitter follower transistor $Q_1$ which has the pair of back-to-back diodes $D_2$ and $D_3$ connected between its base and collector with the midpoint node 21 between the anodes of $D_2$ and $D_3$ connected by way of the current limiting resistor 22 to the positive terminal 23 of the d-c voltage source $V_{cc}$. The collector of $Q_1$ is further connected directly to the base of the first transistor $Q_2$ of the Darlington pair $Q_2, Q_3$ and by way of the current limiting resistor 24 to the positive terminal 23. The collector of $Q_2$ is connected to terminal 23 and its emitter to the base of $Q_3$. The collector of $Q_3$ is connected to the base of $Q_2$ by way of the diode clamp $D_4$. The collector of $Q_3$ is also connected by way of current limiting resistor 25 to the positive terminal 23. The emitter of $Q_3$ is connected to the output terminal 26 and its base is connected to the output terminal by way of the resistor 27 which provides a load for the discharge of $Q_3$. The diode $D_5$ is connected between the output terminal 26 and the collector of $Q_1$. While this diode may be omitted, its presence provides additional current to $Q_1$ when the output has a large capacitance and so speeds the operation of $Q_5$.

The emitter of $Q_1$ supplies the base current of output transistor $Q_5$ by way of resistor 28. The diode clamp $D_6$ connects the collector of $Q_5$ directly to the emitter of $Q_1$ and by way of resistor 28 to the base of $Q_5$.

Advantageously, the emitter of $Q_1$ is connected by way of resistor 29 to the base of the Schottky pull-down transistor $Q_4$. The emitter of $Q_4$ is connected to the terminal 30, which typically is ground. The collector of $Q_4$ is connected by way of resistor 31 to the base of the $Q_5$ whose emitter is connected to the negative terminal 30.

The speed of $Q_4$ is not critical and for this reason a standard Schottky transistor is adequate and so is used in the circuit described. However, the speed of the other transistors in the circuit is desirably faster than conveniently achieved with a Schottky transistor using a platinum silicide Schottky diode; and accordingly, advantageously the other transistors are operated in accordance with the invention to provide a voltage at the collector higher than characteristic of a Schottky transistor.

To this end, the base-collector branch of $Q_1$ includes $D_2$ and $D_3$ and it is characteristic of the arrangement described that the voltage at the base will be $V_{be}$, at the node of the two diodes it will be $V_{be}+V_d$, and at the collector it will be $V_{be}$, which is greater by $V_d$ than would be the case with a standard Schottky transistor.

Additionally, in the Darlington pair $Q_2,Q_3$, the inclusion of $D_4$ in the branch path between the collector of $Q_3$ and the base of $Q_2$ results in the collector of $Q_3$ being clamped at a voltage given by $2 V_{be}-V_d$.

Finally, with respect to $Q_5$, the inclusion of diode $D_6$ and resistor 28 in its collector-base branch path results in a voltage at its collector of $V_{be}-V_d+$ the voltage drop across the resistor 28.

Accordingly, it is seen that in each of these three branch circuits a novel arrangment serves to clamp the extrinsic collector of the transistor at a voltage higher than the voltage normally associated with the clamping action in a standard Schottky transistor.

The circuit otherwise operates in conventional fashion: The Darlington pair serves to increase the speed of turning on of the output transistor by reducing the output impedance; the pull-down transistor serves to improve the speed of turning off the output transistor by providing improved drainage of its stored charge and to improve noise margins by maintaining a high impedance when the input voltage is below threshold; and the emitter-follower phase splitting transistor serves to provide appropriately phased voltages to the Darlington pair, the output transistor and the pull-down transistor under control of the applied input signals.

It will be characteristic of the circuit described that the output transistor which handles the largest d-c currents have the largest geometry, that each section of Darlington-pair transistors, which handles the largest dynamic current pulse, have a geometry about one-half that of the output transistor, and that each of the phase shifting transistor and the pull-down transistor which handle only small currents have a geometry about one-quarter that of the output transistor. Moreover, with the exception of the input diodes which should be relatively large, the other diodes may be of minimal geometry since they handle only small currents.

It should of course be evident that the specific embodiment described involving three novel switches is simply a preferred embodiment and other circuits may be devised using one or more of the novel switches. Additionally, although the invention presently seems most useful when employed with platinum silicide diodes because of the special need they have because of their relatively high barrier height, the principles should be applicable to other forms if a similar need develops to increase the clamping voltage above that normally associated with a Schottky transistor.

Similarly, it is to be understood that typically the invention involves the use of a monolithic integrated circuit rather than of discrete devices. The fabrication of the circuit depicted, for example, can be made readily in monolithic integrated circuit form by conventional techniques known to workers in the art involving dielectric or P-N junction isolation for isolating the various circuit elements and metallic overlays for providing the desired interconnections.

What is claimed is:
1. A circuit arrangement comprising
    a first terminal to be maintained at a reference potential,
    a second terminal to be maintained at an operating potential,
    an input terminal to be supplied with an input signal,
    an output terminal at which an output signal will be developed,
    a first junction transistor,
    means for coupling the input terminal to the base of the first transistor,
    a first and a second Shottky diode connected back-to-back between the collector and base of the first transistor,
    means for resistively coupling the node between said two diodes to the second terminal,
    a second and a third junction transistor,
    the base of said second transistor connected to the collector of the first transistor and resistively coupled to the second terminal,
    the collector of said second transistor connected to the second terminal,
    the emitter of said second transistor being connected to the base of the third transistor and resistively coupled to the output terminal,
    the collector of said third transistor being resistively coupled to the second terminal,
    the emitter of said third transistor being connected to the output terminal,
    a third Schottky diode having its anode connected to the base of the second transistor and its cathode to the collector of the third transistor,
    a fourth Schottky transistor having its base resistively coupled to the emitter of the first transistor, its emitter connected to the first terminal,
    a fifth junction transistor having its emitter connected to the first terminal, its collector connected to the output terminal, and its base resistively coupled to the collector of the fourth transistor and resistively coupled to the emitter of the first transistor,
    and a fourth Schottky diode having its anode connected to the emitter of the first transistor and its cathode to the output terminal whereby it is resistively connected between the collector and base of the fifth transistor.
2. A circuit arrangement in accordance with claim 1 further comprising a fifth Schottky diode having its anode connected to the output terminal and its cathode to the collector of the first transistor.

* * * * *